(12) United States Patent
Chen et al.

(10) Patent No.: US 10,644,162 B2
(45) Date of Patent: May 5, 2020

(54) METHOD FOR MANUFACTURING AN ARRAY SUBSTRATE, DISPLAY PANEL AND DISPLAY DEVICE

(71) Applicant: BOE TECHNOLOGY GROUP CO., LTD., Beijing (CN)

(72) Inventors: Jiangbo Chen, Beijing (CN); Jianhua Du, Beijing (CN); Guoying Wang, Beijing (CN); Wei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 110 days.

(21) Appl. No.: 15/737,277

(22) PCT Filed: Aug. 10, 2017

(86) PCT No.: PCT/CN2017/096775
§ 371 (c)(1),
(2) Date: Dec. 15, 2017

(87) PCT Pub. No.: WO2018/033011
PCT Pub. Date: Feb. 22, 2018

(65) Prior Publication Data
US 2019/0273164 A1    Sep. 5, 2019

(30) Foreign Application Priority Data

Aug. 19, 2016    (CN) .......................... 2016 1 0696449

(51) Int. Cl.
*H01L 29/786* (2006.01)
*H01L 29/24* (2006.01)
(Continued)

(52) U.S. Cl.
CPC .. *H01L 29/78618* (2013.01); *H01L 21/02565* (2013.01); *H01L 21/02592* (2013.01);
(Continued)

(58) Field of Classification Search
None
See application file for complete search history.

(56) References Cited

U.S. PATENT DOCUMENTS

| 8,420,457 B2 * | 4/2013 | Kim | H01L 29/7869 |
| | | | 257/E21.414 |
| 2004/0124417 A1 | 7/2004 | So et al. | |

(Continued)

FOREIGN PATENT DOCUMENTS

| CN | 101609843 A | 12/2009 |
| CN | 102651317 A | 8/2012 |

(Continued)

OTHER PUBLICATIONS

Search Report for International Application No. PCT/CN2017/096775 dated Oct. 11, 2017.

(Continued)

*Primary Examiner* — Robert K Carpenter
(74) *Attorney, Agent, or Firm* — Calfee, Halter & Griswold LLP

(57) ABSTRACT

A method for manufacturing an array substrate, a display panel and a display device are provided. The method includes forming a semiconductor layer, a gate insulating layer, a gate and an inter-layer insulator successively on a base substrate; forming via holes in the inter-layer insulator so as to expose portions of the semiconductor layer; performing plasma bombardment to the portions of the semiconductor layer exposed in the via holes; forming a source electrode and a drain electrode coupled with the semiconductor layer through the via holes respectively on the inter-layer insulator.

15 Claims, 3 Drawing Sheets

(51) Int. Cl.
   *H01L 29/66*   (2006.01)
   *H01L 27/12*   (2006.01)
   *H01L 27/32*   (2006.01)
   *H01L 21/02*   (2006.01)
   *H01L 21/383*  (2006.01)

(52) U.S. Cl.
   CPC .......... *H01L 21/383* (2013.01); *H01L 27/124* (2013.01); *H01L 27/127* (2013.01); *H01L 27/1225* (2013.01); *H01L 27/32* (2013.01); *H01L 27/3262* (2013.01); *H01L 27/3272* (2013.01); *H01L 27/3279* (2013.01); *H01L 29/247* (2013.01); *H01L 29/66969* (2013.01); *H01L 29/7869* (2013.01); *H01L 29/78633* (2013.01); *H01L 29/78693* (2013.01); *H01L 2227/323* (2013.01)

(56) References Cited

U.S. PATENT DOCUMENTS

| | | |
|---|---|---|
| 2009/0315026 A1 | 12/2009 | Jeong et al. |
| 2013/0171836 A1 | 7/2013 | Liu et al. |
| 2015/0123118 A1 | 5/2015 | Yeom et al. |
| 2015/0221669 A1 | 8/2015 | Sun |
| 2016/0372605 A1* | 12/2016 | Kishida ............. H01L 29/78606 |
| 2017/0133475 A1 | 5/2017 | Min |
| 2018/0190812 A1* | 7/2018 | Shi ................... H01L 29/66969 |

FOREIGN PATENT DOCUMENTS

| | | |
|---|---|---|
| CN | 103489918 A | 1/2014 |
| CN | 104637952 A | 5/2015 |
| CN | 104979215 A | 10/2015 |
| CN | 106206612 A | 12/2016 |

OTHER PUBLICATIONS

First Office Action for Chinese Patent Application No. 201610696449.5 dated Aug. 1, 2018.

* cited by examiner

METHOD FOR MANUFACTURING AN ARRAY SUBSTRATE, DISPLAY PANEL AND DISPLAY DEVICE

RELATED APPLICATION

The present application is the U.S. national phase entry of PCT/CN2017/096775, with an international filing date of Aug. 10, 2017, which claims priority of the Chinese patent application No. 201610696449.5 filed on Aug. 19, 2016, the entire disclosure of which is incorporated herein by reference.

FIELD

This disclosure relates to the field of display technology, particularly to a method for manufacturing an array substrate, a display panel and a display device.

BACKGROUND

The oxide transistor technology as a technical hotspot at the present stage has the characteristics of high mobility and good uniformity etc. However, when manufacturing an array substrate comprising the oxide transistor, dry etching will be performed to an inter-layer insulator so as to form a via hole for connecting a semiconductor layer, and form a source electrode and a drain electrode coupled with the semiconductor layer through the via hole. At present, there are mainly the following several ways to improve the resistance generated by contact of the source electrode or the drain electrode with the semiconductor layer: changing the size of the via hole; changing the shape of the via hole; increasing the number of the via holes; inserting a transition layer on the semiconductor layer; changing the material of the source electrode or the drain electrode.

However, for the case where the design scheme of the via hole in the array substrate has been determined, the resistance cannot be improved by the first three methods as stated above. The method of inserting a transition layer not only will increase the risk of influencing the yield, but also will increase the production cost accordingly. As for the improving method of changing the material of the source electrode or the drain electrode, wiring of a medium or large size display device driven by AMOLED generally uses Al or Cu, hence, there are extremely few materials for selection and change. It can be seen that, the prior art fails to make improvement to the resistance generated by contact of the source electrode or the drain electrode with the semiconductor layer in the event that the design scheme of the via hole and the material of the source electrode or the drain electrode have both been determined.

SUMMARY

Embodiments of this disclosure provide an improved method for manufacturing an array substrate, a display panel and a display device.

According to an aspect of this disclosure, an embodiment of this disclosure provides a method for manufacturing an array substrate, comprising:

forming a semiconductor layer, a gate insulating layer, a gate and an inter-layer insulator successively on a base substrate;

forming via holes in the inter-layer insulator so as to expose portions of the semiconductor layer;

performing plasma bombardment to the portions of the semiconductor layer exposed in the via holes;

forming a source electrode and a drain electrode connected with the semiconductor layer through the via holes respectively on the inter-layer insulator.

According to some embodiments, a material of forming the semiconductor layer is determined based on a preset contact resistance, wherein the contact resistance is a resistance generated by contact of the source electrode or the drain electrode with the semiconductor layer.

According to some embodiments, a time of the plasma bombardment is in negative correlation with a contact resistance, wherein the contact resistance is a resistance generated by contact of the source electrode or the drain electrode with the semiconductor layer.

According to some embodiments, a flux of the plasma bombardment is in negative correlation with a contact resistance, wherein the contact resistance is a resistance generated by contact of the source electrode or the drain electrode with the semiconductor layer.

According to some embodiments, an intensity of the plasma bombardment is in negative correlation with a contact resistance, wherein the contact resistance is a resistance generated by contact of the source electrode or the drain electrode with the semiconductor layer.

According to some embodiments, the semiconductor layer is formed by amorphous InGaZnO, and an oxygen content of the amorphous InGaZnO is in negative correlation with a contact resistance, wherein the contact resistance is a resistance generated by contact of the source electrode or the drain electrode with the semiconductor layer.

According to some embodiments, a gas used in the plasma bombardment is selected from helium, nitrogen, ammonia and hydrogen.

According to some embodiments, forming via holes in the inter-layer insulator comprises: performing dry etching to the inter-layer insulator by carbon tetrafluoride and oxygen.

According to some embodiments, a thickness of the inter-layer insulator formed is greater than or equal to about 100 nanometers and less than or equal to about 500 nanometers.

According to some embodiments, after forming the gate and before forming the inter-layer insulator, the method further comprises: forming a source region and a drain region in regions of the semiconductor layer that are not covered, the source region and the drain region receiving an external electric signal through the source electrode and the drain electrode, respectively.

According to some embodiments, before forming the semiconductor layer, the method further comprises: forming a light shielding layer on the base substrate.

According to some embodiments, before forming the semiconductor layer and after forming the light shielding layer, the method further comprises: forming a buffer layer on the light shielding layer.

According to some embodiments, after forming the source electrode and the drain electrode, the method further comprises: forming a passivation layer on the source electrode and the drain electrode.

According to another aspect of this disclosure, an embodiment of this disclosure provides a display panel, comprising: the array substrate manufactured by the above method.

According to a further aspect of this disclosure, an embodiment of this disclosure provides a display device, comprising: the above display panel.

DETAILED DESCRIPTION

Embodiments of this disclosure provide a method for manufacturing an array substrate, a display panel and a display device, wherein, before forming the source electrode and the drain electrode, plasma bombardment is performed to the exposed portions of the semiconductor layer through the via holes, to bombard oxygen atoms out of the semiconductor layer by atomic bombardment of the plasma, so as to form more oxygen vacancy defects, thereby increasing the concentration of electronic carriers, and reducing the resistance generated by contact of the source electrode or the drain electrode formed afterwards with the semiconductor layer, thereby increasing the On state current of the transistor.

Next, the technical solutions in this disclosure will be described clearly and completely in conjunction with the drawings in the embodiments of this disclosure. Apparently, the embodiments described are only a part of rather than all of the embodiments of this disclosure. Based on the embodiments in this disclosure, all other embodiments obtained by the ordinary skilled person in the art on the premise of not paying any inventive effort belong to the protection scope of this disclosure.

Figure 1:
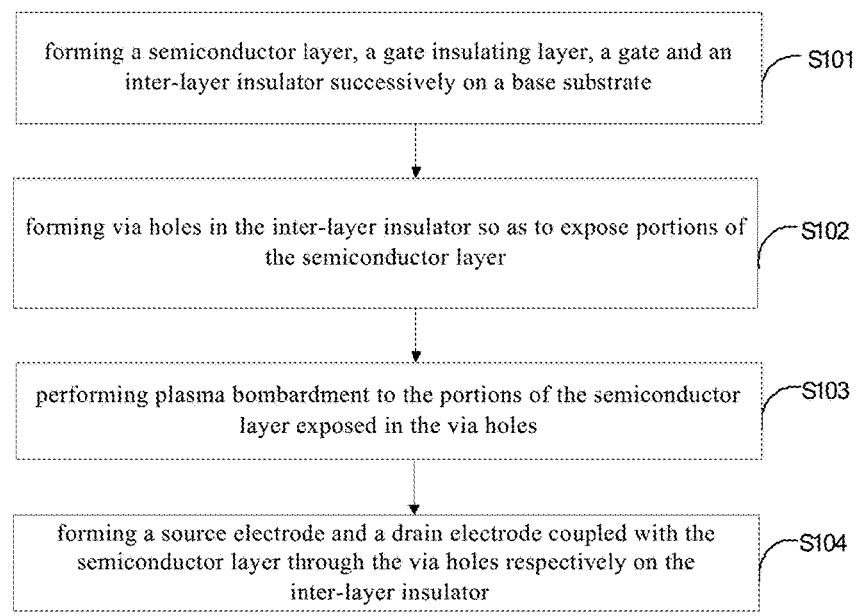
FIG. 1 is a schematic flow chart of a method for manufacturing an array substrate provided by an embodiment of this disclosure.

Referring to FIG. 1, an embodiment of this disclosure provides a method for manufacturing an array substrate, comprising:

in step S101, forming a semiconductor layer, a gate insulating layer, a gate and an inter-layer insulator successively on a base substrate;

in step S102, forming via holes in the inter-layer insulator so as to expose portions of the semiconductor layer;

in step S103, performing plasma bombardment to the portions of the semiconductor layer exposed in the via holes;

in step S104, forming a source electrode and a drain electrode coupled with the semiconductor layer through the via holes on the inter-layer insulator.

Figure 2:
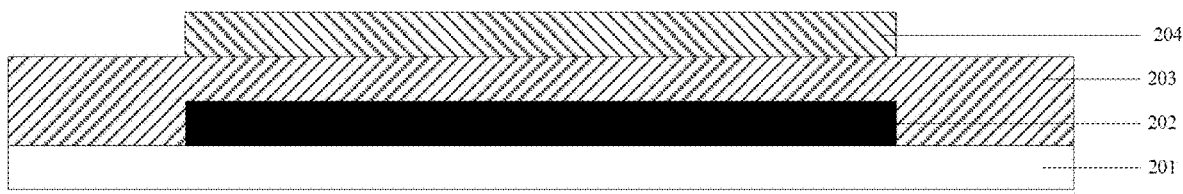
FIG. 2 is a structural schematic diagram of an array substrate provided by an embodiment of this disclosure after forming a semiconductor layer in the manufacturing process.
Figure 3:
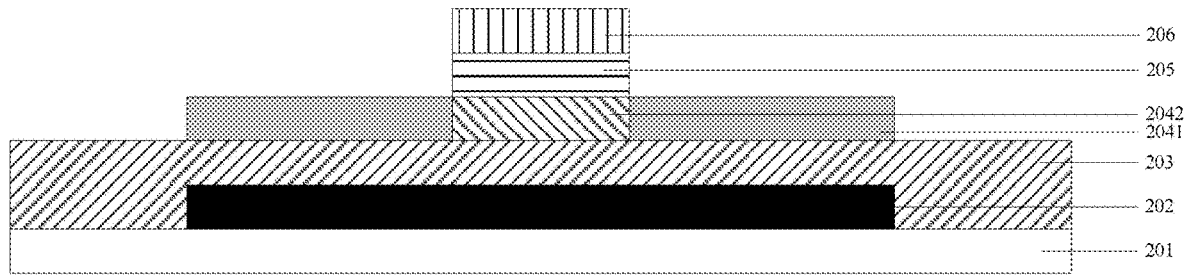
FIG. 3 is a structural schematic diagram of an array substrate provided by an embodiment of this disclosure after forming a gate metal layer in the manufacturing process.

Specifically, referring to FIG. 2 and FIG. 3, the step S101 comprises:

cleaning the base substrate (e.g., a glass substrate) 201 by a standard method;

depositing a light shielding layer 202 on the base substrate 201 by sputtering method or evaporating method, and patterning the light shielding layer 202 as required, wherein the thickness of the light shielding layer is greater than or equal to 50 nanometers and less than or equal to 400 nanometers;

forming a buffer layer 203 on the formed light shielding layer 202 using the plasma enhanced chemical vapor deposition (PECVD) process, wherein the thickness of the buffer layer is greater than or equal to 100 nanometers and less than or equal to 500 nanometers;

depositing a semiconductor layer 204 on the formed buffer layer 203 using a sputtering process, and patterning the formed semiconductor layer 204 as required, wherein the thickness of the semiconductor layer 204 is greater than or equal to 10 nanometers and less than or equal to 100 nanometers;

forming a gate insulating layer 205 on the formed semiconductor layer 204 using a plasma enhanced chemical vapor deposition process, wherein the thickness of the gate insulating layer is greater than or equal to 100 nanometers and less than or equal to 500 nanometers, and the material of forming the gate insulating layer is SiOx;

depositing a gate metal layer 206 on the formed gate insulating layer 205 by a sputtering process or an evaporating process, and patterning the formed gate metal layer 206 as required, wherein the thickness of the gate metal layer is greater than or equal to 50 nanometers and less than or equal to 400 nanometers;

patterning the gate insulating layer 205 and the gate metal layer 206, and processing the exposed regions of the semiconductor layer 204, so as to obtain a source region and a drain region 2041 of a thin film transistor, and the unprocessed region of the semiconductor layer 204 that is shielded by the gate insulating layer 205 and the gate metal layer 206 is a channel region 2042 of the thin film transistor. The processing may include ion injection or plasma bombardment etc.

In an exemplary embodiment, when depositing the semiconductor layer, the ratio of the flux of oxygen and the sum of the fluxes of oxygen and argon is in a range of 0%-50%, in which case the thickness of the semiconductor layer obtained from deposition is in a range of 2 nanometers to 200 nanometers. Specifically, when the ratio of the flux of oxygen and the sum of the fluxes of oxygen and argon is 5%, the semiconductor layer obtained from deposition is optimal, in which case the thickness of the semiconductor layer obtained from deposition is 40 nanometers.

In addition, the thickness of the semiconductor layer obtained from deposition is related to the pressure and the power of the cavity of the device for depositing a film, as well as to the number of times of deposition scan. When the pressure of the cavity of the device for depositing a film is 0.63 Pa, the power of the device is 4500 W, and the number of times of the deposition scan is 5, the flux of argon is set to 100 ml per minute (SCCM), and the flux of oxygen is set to 0.13 ml per minute (SCCM), the thickness of the semiconductor layer is 40 nanometers, i.e., the optimal thickness. In an exemplary embodiment, the pressure of the cavity of the device for depositing a film is in a range of 0.01 Pa to 100 Pa, the power of the device is in a range of 1 KW to 10 KW, the number of times of the deposition scan is in a range of 1 to 30, the flux of argon is set in a range of 0 ml per minute to 500 ml per minute, the flux of oxygen is set in a range of 0 ml per minute to 500 ml per minute, and the above parameters are all related to the device for depositing a film.

Figure 4:
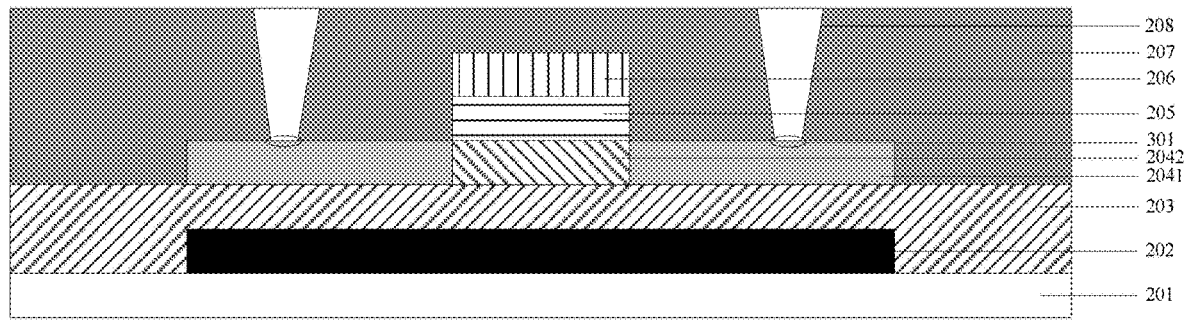
FIG. 4 is a structural schematic diagram of an array substrate provided by an embodiment of this disclosure after forming an inter-layer insulator and via holes in the manufacturing process.

Referring to FIG. 4, the step S102 comprises:

forming an inter-layer insulator (ILD) 207 on the gate metal layer 206 using a plasma enhanced chemical vapor deposition process, and patterning the inter-layer insulator 207 as required, wherein the thickness of the inter-layer insulator is greater than or equal to 100 nanometers and less than or equal to 500 nanometers, and the material of forming the inter-layer insulator is SiOx;

after patterning the inter-layer insulator 207, performing dry etching to the inter-layer insulator 207 using carbon tetrafluoride and oxygen until portions of the semiconductor layer 204 are exposed, thereby forming via holes 208.

In the process of forming the inter-layer insulator 207 and the via holes 208, the electrical property of the lower semiconductor layer 204 will be somewhat reduced, so that the contact resistance generated when in contact with the source electrode or the drain electrode will be increased, hence, the semiconductor layer 204 needs to be processed further.

Specifically, after forming the via holes 208, a plasma bombardment process is performed to the exposed portions of the semiconductor layer 204 (i.e., at the circles 301 in FIG. 4) through the via holes 208, i.e., performing the step S103. The plasma bombardment process is He plasma bombardment or $N_2$ plasma bombardment or $NH_3$ plasma bombardment or $H_2$ plasma bombardment.

In embodiments of this disclosure, if the plasma bombardment process is helium plasma bombardment, the helium plasma bombardment radicals will not be diffused to the channel region of the semiconductor layer, hence, after plasma bombardment, the diffusion problem of the plasma bombardment radicals in the semiconductor layer will be weakened greatly, thereby further reducing the resistance generated by contact of the source electrode or the drain electrode with the semiconductor layer.

Figure 5:
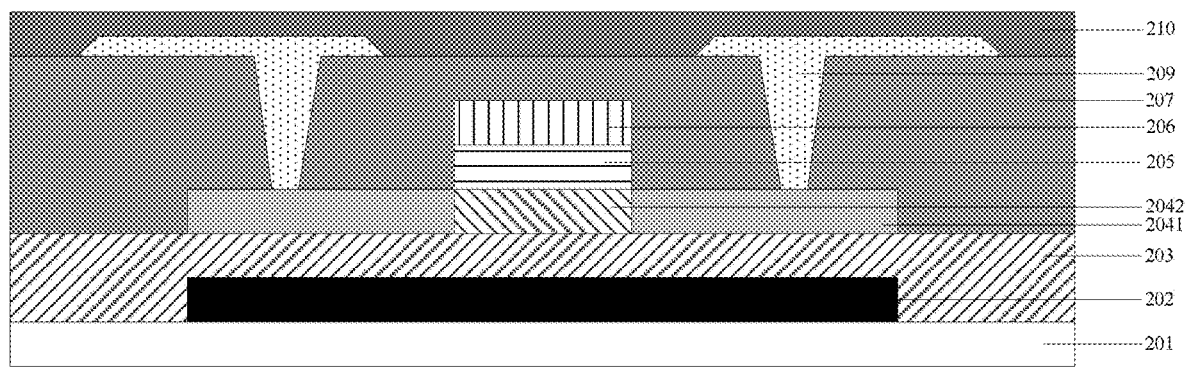
FIG. 5 is a structural schematic diagram of an array substrate provided by an embodiment of this disclosure

Referring to FIG. 5, the step S104 comprises:

depositing a source-drain electrode metal on the inter-layer insulator 207 by sputtering, and patterning the source-drain electrode metal as required so as to form a source electrode and a drain electrode 209, and the source electrode and the drain electrode 209 are connected with the source region and the drain region 2041 of the semiconductor layer 204 through the via holes 208, respectively, wherein the thickness of the source electrode or the drain electrode is greater than or equal to 50 nanometers and less than or equal to 400 nanometers.

After the step S104, as shown in FIG. 5, the method may further comprise:

forming a passivation layer 210 on the source electrode and the drain electrode 209 using a plasma enhanced chemical vapor deposition process, and patterning the passivation layer 210 as required, wherein the thickness of the passivation layer is greater than or equal to 200 nanometers and less than or equal to 400 nanometers, and the material of forming the passivation layer is SiOx or SiNx.

For the convenience of understanding, next, the solutions of this disclosure will be further explained through the embodiments.

It is assumed that the material for manufacturing the semiconductor layer is amorphous InGaZnO. In an embodiment of this disclosure, the semiconductor layer can be made of a material with a low oxygen content, so as to further reduce the resistance generated by contact of the source electrode or the drain electrode with the semiconductor layer.

Specific experimental data is shown in the following Table 1:

In Table 1, the "Plasma treatment" represents the plasma bombardment process; the "Different" represents the specific operation condition; the 'Slot" represents the experiment serial number; the "Avg." represents the average value of the contact resistance; the "Max" represents the maximum value of the contact resistance; the "Min" represents the minimum value of the contact resistance; the "Uniformity" represents the uniformity, meaning the stability of the process steps; the "3σ" represents the derivation value of the experimental data; the "CF4+O2" represents performing dry etching to the inter-layer insulator using carbon tetrafluoride and oxygen; the "OE 30 s" represent performing the dry etching for 30 seconds; the "He" represents processing the exposed portions of the semiconductor layer within the via holes using He plasma bombardment process; the "InGaZnO 20% 10 s" represents performing He plasma bombardment process to the semiconductor layer for 10 seconds, wherein the material of the semiconductor layer is amorphous InGaZnO with an oxygen content of 20%.

If, after the inter-layer insulator is patterned, only carbon tetrafluoride and oxygen are used to perform dry etching to the inter-layer insulator for 30 seconds, the contact resistance between the source electrode or the drain electrode 209 with the etching regions 301 is greater than or equal to 15570Ω, and less than or equal to 16410Ω, and the average value of the contact resistance is 16064Ω.

If, after the dry etching is performed to the inter-layer insulator for 30 seconds, a He plasma bombardment process is performed to the exposed portions of the semiconductor layer 204 within the via holes through the via holes 208 for 10 seconds, the contact resistance between the source electrode or the drain electrode 209 and the etching area 301 is greater than or equal to 1425Ω, and less than or equal to 1494Ω, and the average value of the contact resistance is 1460Ω.

It can be seen that by performing He plasma bombardment to the exposed portions of the semiconductor layer within the via holes, the contact resistance between the source electrode or the drain electrode and the semiconductor layer is reduced by order of magnitude compared with the contact resistance of not performing He plasma bombardment. Hence, the On state current of the transistor is increased.

With respect to the same semiconductor layer 204, if the He plasma bombardment process is performed to the exposed portions of the semiconductor layer 204 within the via holes through the via holes 208 for 30 seconds, the contact resistance between the source electrode or the drain electrode 209 and the etching area 301 is greater than or equal to 997Ω, and less than or equal to 1078Ω, and the average value of the contact resistance is 1026Ω.

It can be seen that time of performing plasma bombardment process to the exposed regions of the semiconductor layer through the via holes is in negative correlation with the contact resistance within a certain range. Specifically, the range of time of the plasma bombardment process is 0

TABLE 1

| Plasma treatment | Different | Slot | Avg. | Max | Min | Uniformity | 3σ |
|---|---|---|---|---|---|---|---|
| CF4 + O2 | OE 30 s | 10 | 16064.44 | 16410 | 15570 | 2.63% | 872.7256 |
| He | IGZO 20% 10 s | 6 | 1460.333 | 1494 | 1425 | 2.36% | 64.51744 |
|  | IGZO 20% 30 s | 5 | 1025.833 | 1078 | 997 | 3.90% | 74.02618 |
|  | IGZO 10% 30 s | 2 | 962.7667 | 1038 | 923.2 | 5.85% | 103.9838 |
|  | IGZO 5% 30 s | 1 | 861.8667 | 883.7 | 845 | 2.24% | 37.89037 | second to 300 seconds, wherein the contact resistance is a resistance generated by contact of the source electrode or the drain electrode with the semiconductor layer. It has been verified that when time of performing plasma bombardment process to the exposed portions of the semiconductor layer within the via holes is 40 seconds, the effect of the plasma bombardment process is optimal, i.e., by mean of the plasma bombardment process, the resistance generated by contact of the source electrode or the drain electrode with the semiconductor layer is minimum.

If the dry etching is also performed for 30 seconds, and the He plasma bombardment process is also performed to the exposed portions of the semiconductor layer within the via holes through the via holes for 30 seconds, while the oxygen content of the amorphous InGaZnO for forming the semiconductor layer is different, the contact resistance between the source electrode or the drain electrode 209 and the etching area 301 will be different. It has been proved by experiment that under the above process condition, when the oxygen content of the amorphous InGaZnO is 20%, the contact resistance is greater than or equal to 997Ω, and less than or equal to 1078Ω, and the average value of the contact resistance is 1026Ω; when the oxygen content of the amorphous InGaZnO is 10%, the contact resistance is greater than or equal to 923.2Ω, and less than or equal to 1038Ω, and the average value of the contact resistance is 963Ω; when the oxygen content of the amorphous InGaZnO is 5%, the contact resistance is greater than or equal to 845Ω, and less than or equal to 883.7Ω, and the average value of the contact resistance is 862Ω.

It can be seen that the oxygen content of the amorphous InGaZnO for forming the semiconductor layer is in negative correlation with the contact resistance in a certain range, wherein the contact resistance is a resistance generated by contact of the source electrode or the drain electrode with the semiconductor layer.

The contact resistance is also in negative correlation with the flux of the plasma bombardment process in a certain range, wherein the flux of the He plasma bombardment process is in a range of 0 ml per minute to 500 ml per minute. When the flux of the He plasma bombardment process is 200 ml per minute, the resistance generated by contact of the source electrode or the drain electrode with the semiconductor layer is minimal.

The contact resistance is also in negative correlation with the plasma bombardment intensity in a certain range, i.e., with the increase of the pressure and the power of the cavity of the reactive ion etching device within a certain range, the resistance generated by contact of the source electrode or the drain electrode with the semiconductor layer will be reduced. Specifically, the pressure of the cavity of the reactive ion etching device is in a range of 0 millitorr to 1000 millitorrs, and the power thereof is in a range of 0 W to 1000 W. It has been verified that when the pressure of the cavity of the reactive ion etching device is 50 millitorrs, and the power is 600 W, the effect of the plasma bombardment process is optimal, i.e., by the plasma bombardment process, the resistance generated by contact of the source electrode or the drain electrode with the semiconductor layer is minimal.

In embodiments of this disclosure, the resistance generated by contact of the source electrode or the drain electrode with the semiconductor layer can be further reduced by prolonging the time of the plasma bombardment, increasing the flux of the plasma bombardment process, and increasing the intensity of the plasma bombardment process.

In the above embodiment, since the amorphous InGaZnO is a wide band gap oxide semiconductor material, the resistance generated by contact with the source electrode or the drain electrode is Schottky contact, resulting a relatively large contact resistance. The plasma bombardment is performed to the exposed portions of the semiconductor layer through the via holes in the inter-layer insulator, so as to bombard oxygen atoms out of the amorphous InGaZnO through atomic bombardment of the plasma and form more oxygen vacancy defects. Since the oxygen vacancy defects in the oxide are donor defects, the increase of the oxygen vacancies will increase the concentration of the electronic carriers, thereby reducing the resistance generated by contact of the source electrode or the drain electrode with the semiconductor layer and in turn increasing the On state current of the transistor.

An embodiment of this disclosure provides a display panel, comprising an array substrate manufactured by the above method.

An embodiment of this disclosure provides a display device, comprising the above display panel.

To sum up, embodiments of this disclosure have provided a method for manufacturing an array substrate, a display panel and a display device, wherein plasma bombardment is performed to the exposed portions of the semiconductor layer through the via holes, to bombard oxygen atoms out of the semiconductor layer by atomic bombardment of the plasma, so as to form more oxygen vacancy defects, thereby increasing the concentration of electronic carriers, and reducing the resistance generated by contact of the source electrode or the drain electrode formed afterwards with the semiconductor layer, thereby increasing the On state current of the transistor.

The skilled person in the art will understand that the embodiments of this disclosure can be provided as a method, a system or a computer program product. Hence, this disclosure can use the form of complete hardware embodiments, complete software embodiments, or embodiments of combination of software and hardware. Moreover, this disclosure can use the form of a computer program product implemented on one or more computer usable storage mediums (including but not limited to disk memory and optical memory etc.) containing computer usable program codes.

This disclosure is described with reference to a flow chart and/or a block diagram of the method, the device (system), and the computer program product according to the embodiments of this disclosure. It should be understood that each flow and/or block in the flow chart and/or block diagram, as well as combination of the flows and/or blocks in the flow chart and/or block diagram can be carried out by computer program instructions. These computer program instructions can be provided to a processor of a general computer, a special purpose computer, an embedded processor or other programmable data processing devices to generate a machine, so as to generate devices for implementing the functions designated in one or more flows of the flow chart and/or one or more blocks in the block diagram through the instructions executed by the processor of a computer or other programmable data processing devices.

These computer program instructions can also be stored in a computer readable memory that can guide the computer or other programmable data processing devices to work in a particularly manner, so as to enable the instructions stored in the computer readable memory to generate manufactures that include instruction devices. The instruction devices implement the function designated in one or more flows of the flow chart and/or one or more blocks in the block diagram.

These computer program instructions can also be loaded onto the computer or other programmable data processing devices, so as to perform a series of operation steps on the computer or other programmable data processing devices to generate processing carried out by the computer, thereby, the instructions executed on the computer or other programmable data processing devices provide steps for implementing the functions designated in one or more flows of the flow chart and/or one or more blocks in the block diagram.

Apparently, the skilled person in the art can make various amendments and modifications to this disclosure without departing from the spirit and the scope of this disclosure. In this way, provided that these amendments and modifications belong to the scopes of the claims of this disclosure and equivalences thereof, this disclosure also intends to encompass these amendments and modifications.

The invention claimed is:

1. A method for manufacturing an array substrate, comprising:
   forming a semiconductor layer, a gate insulating layer, a gate and an inter-layer insulator successively on a base substrate;
   forming via holes in the inter-layer insulator so as to expose portions of the semiconductor layer;
   performing helium plasma bombardment to the portions of the semiconductor layer exposed in the via holes for 30 to 40 seconds;
   forming a source electrode and a drain electrode coupled with the semiconductor layer through the via holes respectively on the inter-layer insulator,
   wherein a material of the semiconductor layer comprises amorphous InGaZnO, and an oxygen content of the amorphous InGaZnO is not greater than 10%.

2. The method according to claim 1, wherein a flux of the helium plasma bombardment is in negative correlation with a contact resistance, wherein the contact resistance is a resistance generated by contact of the source electrode or the drain electrode with the semiconductor layer.

3. The method according to claim 1, wherein an intensity of the helium plasma bombardment is in negative correlation with a contact resistance, wherein the contact resistance is a resistance generated by contact of the source electrode or the drain electrode with the semiconductor layer.

4. The method according to claim 1, wherein forming via holes in the inter-layer insulator comprises:
   performing dry etching to the inter-layer insulator by carbon tetrafluoride and oxygen.

5. The method according to claim 1, wherein a thickness of the inter-layer insulator formed is greater than or equal to about 100 nanometers and less than or equal to about 500 nanometers.

6. The method according to claim 1, wherein, after forming the gate and before forming the inter-layer insulator, the method further comprises:
   forming a source region and a drain region in regions of the semiconductor layer that are not covered, the source region and the drain region receiving an external electric signal through the source electrode and the drain electrode respectively.

7. The method according to claim 1, wherein, before forming the semiconductor layer, the method further comprises forming a light shielding layer on the base substrate.

8. The method according to claim 7, wherein, before forming the semiconductor layer and after forming the light shielding layer, the method further comprises forming a buffer layer on the light shielding layer.

9. The method according to claim 1, wherein, after forming the source electrode and the drain electrode, the method further comprises forming a passivation layer on the source electrode and the drain electrode.

10. A display panel, comprising an array substrate manufactured by the method as claimed in claim 1.

11. A display device, comprising the display panel as claimed in claim 10.

12. The display panel according to claim 10, wherein a time of the helium plasma bombardment is in negative correlation with a contact resistance, wherein the contact resistance is a resistance generated by contact of the source electrode or the drain electrode with the semiconductor layer.

13. The display panel according to claim 10, wherein the oxygen content of the amorphous InGaZnO is in negative correlation with a contact resistance, wherein the contact resistance is a resistance generated by contact of the source electrode or the drain electrode with the semiconductor layer.

14. The display panel according to claim 10, wherein a flux of the helium plasma bombardment is in negative correlation with a contact resistance, wherein the contact resistance is a resistance generated by contact of the source electrode or the drain electrode with the semiconductor layer.

15. The display panel according to claim 10, wherein an intensity of the helium plasma bombardment is in negative correlation with a contact resistance, wherein the contact resistance is a resistance generated by contact of the source electrode or the drain electrode with the semiconductor layer.

* * * * *